United States Patent [19]
Kobayashi

[11] Patent Number: 5,347,238
[45] Date of Patent: Sep. 13, 1994

[54] BIPOLAR MICROWAVE MONOLITHIC VOLTAGE CONTROLLED OSCILLATOR USING ACTIVE INDUCTORS

[75] Inventor: Kevin W. Kobayashi, Torrance, Calif.

[73] Assignee: TRW Inc., Redondo Beach, Calif.

[21] Appl. No.: 88,009

[22] Filed: Jul. 6, 1993

[51] Int. Cl.⁵ .................... H03B 5/24; H03H 11/04
[52] U.S. Cl. .................... 331/117 R; 331/167; 331/177 R; 333/214
[58] Field of Search ............ 331/117 R, 117 FE, 167, 331/177 R; 333/214, 215

[56] References Cited
U.S. PATENT DOCUMENTS 4,812,785  3/1989  Pauker .......................... 331/117 FE

*Primary Examiner*—Siegfried H. Grimm

[57] ABSTRACT

A voltage controlled oscillator provides a fixed amplitude output at an adjustable frequency. The voltage controlled oscillator includes a first transistor including an emitter, a base, and a collector. A first capacitor is connected between the emitter and the base of the first transistor. An inductance simulating device generates a controllable impedance and includes second and third transistors each with a base, an emitter, and a collector. The second and third transistors are connected between the base and the collector of the first transistor. The controllable impedance includes an inductive reactance component related to a quiescent bias current flowing through the third transistor. A current source connected to the third transistor generates the quiescent bias current to vary the inductive reactance component. The inductive reactance component and the first capacitor vary the adjustable frequency of oscillation.

12 Claims, 4 Drawing Sheets

BIPOLAR MICROWAVE MONOLITHIC VOLTAGE CONTROLLED OSCILLATOR USING ACTIVE INDUCTORS

BACKGROUND OF THE INVENTION

1. Technical Field

The present invention relates to voltage controlled oscillators (VCO) in general, and more particularly to a VCO with tuneable active inductors for tuning a frequency of oscillation.

2. Discussion

Maturing silicon bipolar and Gallium Arsenide (GaAs) hetero-junction bipolar technologies have made microwave monolithic integrated circuits (MMIC) feasible. A common goal for any monolithic circuit is to use design and fabrication techniques to reduce chip size, increase ease of implementation, and reduce costs in high volume production. These design and fabrication techniques should not compromise performance, and if possible, should improve performance.

Microwave frequency voltage controlled oscillators are used widely in High Definition Television (HDTV), cellular phone systems, optical/analog phase-locked loop communication systems, etc. Conventional VCO designs use a series inductance in a feedback loop of a transistor and a fixed capacitance in series with an emitter of the transistor to generate a frequency of oscillation. For monolithic designs, the series inductance is typically a spiral inductor. Fabrication of the spiral inductor on a monolithic chip requires careful modeling, a complicated fabrication process, and large surface areas on a semi-insulating semiconductor substrate such as GaAs.

The surface area required for an inductor increases as the inductance value increases. Since microwave applications typically require inductors with relatively high inductance, the surface area of these inductors adversely affects chip size.

One proposed fabrication solution is to use a conventional multi-vibrator chip in an analog phase-locked loop (PLL) system. While the PLL system does not require spiral inductors and is very compact in size, the PLL system exceeds acceptable phase noise due to its inherently low Q.

SUMMARY OF THE INVENTION

In accordance with the teachings of the present invention, a voltage controlled oscillator provides a fixed amplitude output at an adjustable frequency. The voltage controlled oscillator includes a first transistor including an emitter, a base, and a collector. A first capacitor is connected between the emitter and the base of the first transistor. An inductance simulating device generates a controllable impedance and includes second and third transistors each with a base, an emitter, and a collector. The second and third transistors are connected between the base and the collector of the first transistor. The controllable impedance includes an inductive reactance component related to a quiescent bias current flowing through the emitter of the third transistor. A current source connected to the emitter of the third transistor generates the quiescent bias current to vary the inductive reactance component. The inductive reactance component and the first capacitor vary the adjustable frequency of oscillation.

In a further feature of the invention, the voltage controlled oscillator includes a tuning device for generating a tuning voltage. The quiescent bias current generated by the current source is controlled by the tuning voltage.

In yet another feature of the invention, the second and third transistors are hetero-junction bipolar transistors.

In another feature of the invention, the collector of the third transistor is connected to the emitter of the second transistor.

In still another feature of the invention, the voltage controlled oscillator further includes a second capacitor connected between the base of the second transistor and the emitter of the third transistor.

In yet another feature of the invention, the voltage controlled oscillator includes a tuning resistor connected to the base of the third transistor. A third capacitor is connected to the collector of the second transistor and to the tuning transistor. The inductive reactance component is related to a resistance value of the tuning resistor.

In yet another feature of the invention, the current source includes a fourth bipolar transistor having a base and a collector connected through a first resistor to the tuning device. A fifth bipolar transistor has a collector connected to the emitter of the third transistor, a base connected to the base of the fourth transistor, and an emitter connected to an emitter of the fourth transistor. The quiescent bias current is provided at the collector of the fifth transistor.

Other objects, features and advantages will be readily apparent.

BRIEF DESCRIPTION OF THE DRAWINGS

The various advantages of the present invention will become apparent to those skilled in the art after studying the specification and by referencing the drawings in which.

DESCRIPTION OF THE PREFERRED EMBODIMENTS

Figure 1:
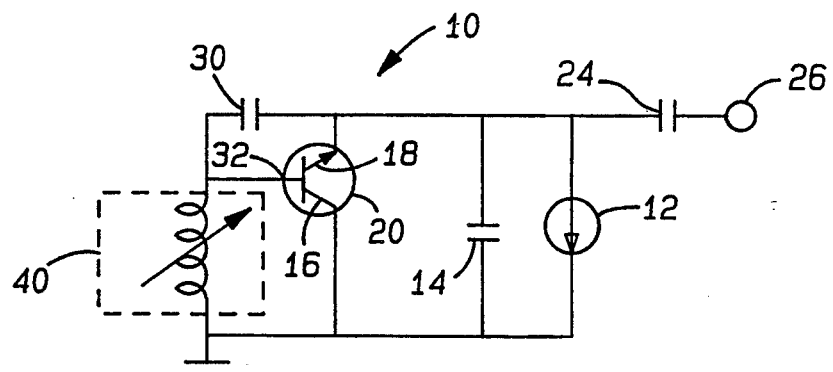
FIG. 1 is a simplified electrical schematic of a voltage controlled oscillator (VCO) with a tuneable active inductor according to the present invention.

In FIG. 1, a simplified electrical schematic of a VCO circuit 10 including a current source 12 is shown. A capacitor 14 provides AC coupling between a collector 16 and an emitter 18 of a transistor 20. A capacitor 24 couples the VCO circuit 10 to an output node 26. A capacitor 30 is connected between the emitter 18 and a base 32 of the transistor 20. A frequency of oscillation of the VCO circuit 10 is related to the capacitance value of the capacitor 30. A tuneable active inductor 40 is connected to the capacitor 30 and between the base 32 and the collector 16 of the transistor 20. The tuneable active inductor 40 provides a variable inductance that, in combination with the capacitor 30, forms an RLC tank circuit which controls the frequency of oscillation of the VCO circuit 10.

Figure 2:
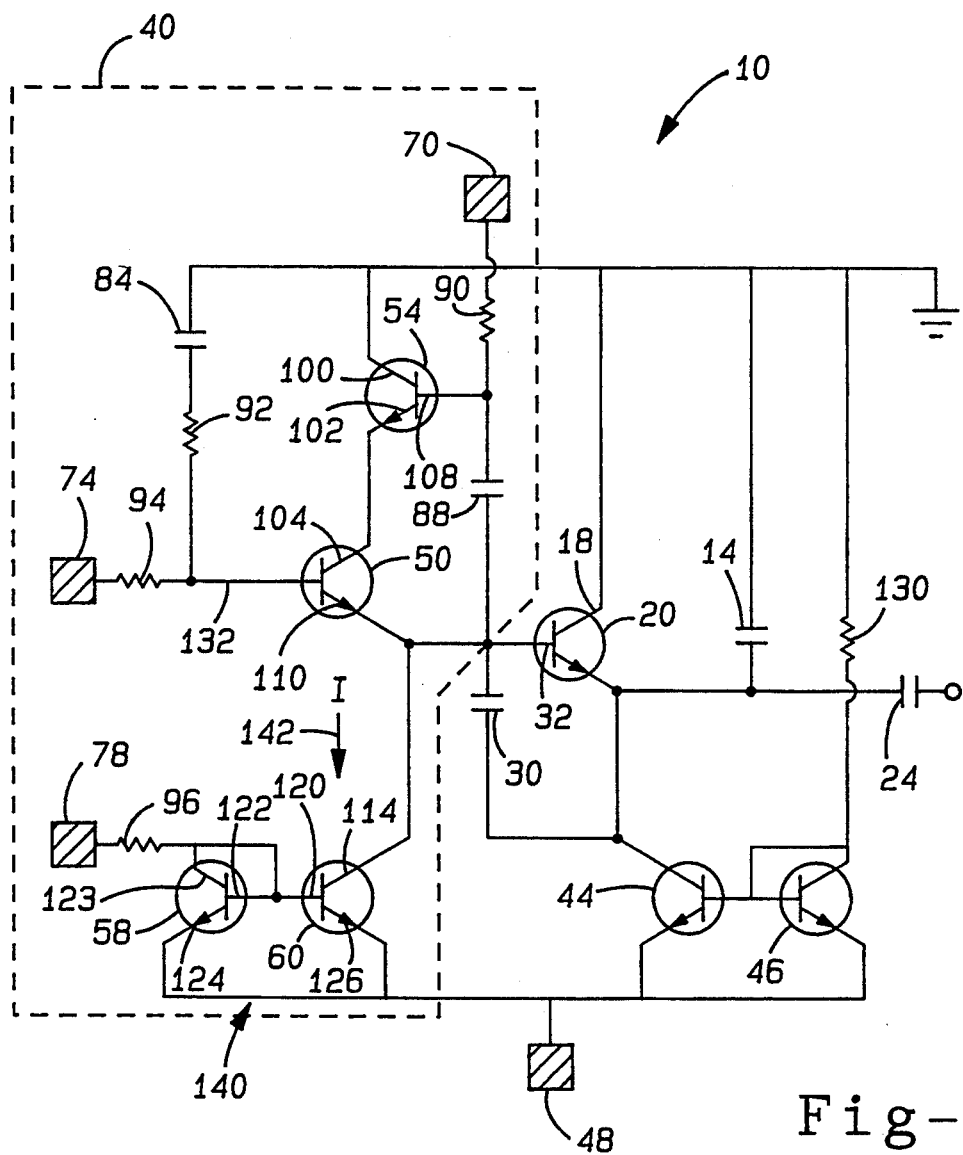
FIG. 2 is a detailed electrical schematic of the VCO of FIG. 1.

In FIG. 2, the VCO circuit 10 of the present invention is shown in greater detail. The current source 12 includes transistors 44 and 46 and a voltage source 48. The capacitor 30 and the capacitor 14 are connected as shown in FIG. 1. The tuneable active inductor 40 includes: transistors 50, 54, 58 and 60; voltage sources 70, 74 and 78; capacitors 84 and 88; and resistors 90, 92, 94, and 96.

A collector 100 of transistor 54 is connected to ground and an emitter 102 of transistor 54 is coupled to a collector 104 of transistor 50. The voltage source 70 and the resistor 90 provide a biasing voltage to a base 108 of the transistor 54. An emitter 110 of the transistor 50 and the base 108 of transistor 54 are coupled through the capacitor 88 which provides feedback to the transistor 54 and acts as a DC block.

The emitter 110 of transistor 50 is connected to the base 32 of the transistor 20 and to a collector 114 of transistor 60. A base 120 of the transistor 60 and a base 122 and a collector 123 of the transistor 58 are connected to the voltage source 78 through the resistor 96. Emitters 124 and 126 of transistors 58 and 60 are both connected to the voltage source 48.

The capacitor 84 couples the capacitor 14, the collector 18 of the transistor 20, a resistor 130, and the collector 100 of the transistor 54 to the resistor 92 and acts as a DC block. The resistor 92 is connected to a base 132 of the transistor 50 and to the voltage source 74 through the resistor 94.

Resistance and capacitance values for the resistor 92 and the capacitor 84 are determined at the time of fabrication, directly affect the frequency of oscillation of the VCO circuit 10, and are provided for rough frequency tuning of the VCO circuit 10.

Figure 3:
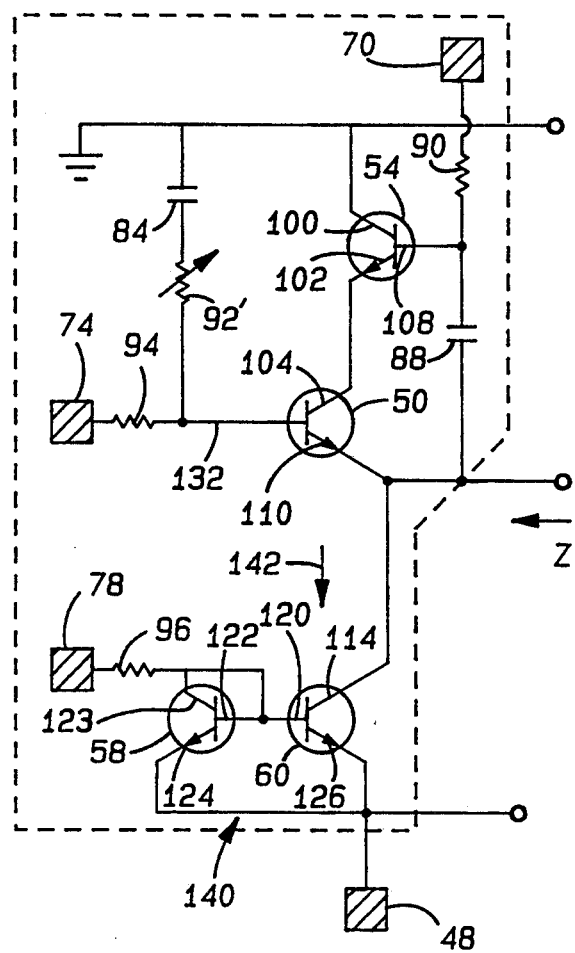
FIG. 3 is an electrical schematic of a controllable impedance of the tuneable active inductor of FIG. 2.

The resistor 92 can be an electronically variable resistor such as a p-i-n diode which can be implemented monolithically using epitaxial layers of a base-collector junction of a HBT transistor. A voltage source resistively coupled to the p-i-n diode varies current flowing therethrough to vary the resistance of the p-i-n diode. Other types of electronically variable resistors are contemplated. FIG. 2 illustrates the VCO 10 with a discrete resistor 92. FIG. 3 illustrates the VCO 10 with an electronically variable resistor 92. The transistor 58, the transistor 60, the resistor 96, and the voltage source 78 provide a post fabrication fine tuning means for the VCO circuit 10. The voltage source 78 can be an off-chip source.

A current mirror/source 140 includes the transistors 58 and 60 and the resistor 96 and functions as a voltage controlled current source to vary a quiescent bias current (indicated by arrow 142 in FIGS. 2 and 3) for the transistors 50 and 54.

As can be appreciated, components of the VCO circuit 10 can be fabricated on a monolithic wafer which is smaller and less expensive than a conventional VCO using, for example, spiral inductors. Each of the transistors 20, 44, 46, 50, 54, 58, and 60 can be a hetero-junction bipolar transistor. Performance objectives, cost reduction, and size reduction can be achieved using the VCO circuit 10, even at microwave frequencies.

In FIG. 3, the tuneable active inductor 40 is shown separate from remaining components of the VCO circuit 10 to illustrate a controllable impedance of the tuneable active inductor 40 as seen by the base 32 of the transistor 20. AC beta ($\beta$) characteristics of the transistors 50 and 54 determine an inductive reactance component of the controllable impedance Z. The AC beta ($\beta$) characteristics can be varied by changing the quiescent bias current (arrow 142). The controllable impedance Z will be described in greater detail below.

Figure 4:
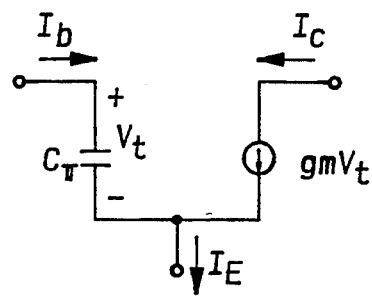
FIG. 4 is a simplified model of a bipolar transistor.

FIG. 4 shows an equivalent modeling circuit of a bipolar transistor after assuming the following model components are zero: $r_e=0$; $r_b=0$; $r_c=0$; and $C_\mu=0$. Then, $$g_m = \frac{I_c}{V_t} = \frac{I_c \cdot q}{kT}, \quad [1]$$

$$C_\pi = C_{depletion} + C_{diffusion}, \quad [2]$$

$$C_\pi = C_{be} + g_m \tau_f, \text{ and} \quad [3]$$

$$C_\pi = C_{be} + \frac{I_c \cdot q}{kT} \tau_f. \quad [4]$$

Figure 5:
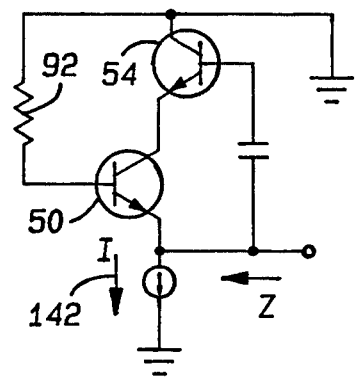
FIG. 5 is a simplified model of the tuneable active inductor.

In FIG. 5, a simplistic tuneable active inductor model is shown in which:

$$Z(\omega) = \frac{1 + j\omega C_{\pi 2} R_{tune}}{g_{m2} + j\omega \left[ C_{\pi 2} - C_{\pi 3}\left(\frac{g_{m2}}{g_{m3}}\right) + \omega^2 C_{\pi 3}\left(\frac{C_{\pi 2} C_{\pi 3}}{g_{m3}^2}\right)\right]} \quad [5]$$

where $g_{m2}$ and $C_{\pi 2}$ are associated with the transistor 50, where $g_{m3}$ and $C_{\pi 3}$ are associated with the transistor 54, and where $R_{tune}$ is equal to a resistance value of the resistor 92.

Since $Q_2$ and $Q_3$ are the same size, then $$C_{\pi 2} = C_{\pi 3} \text{ and } g_{m2} = g_{m3}. \quad [6, 7]$$

Therefore, the $C_\pi$ terms in the denominator cancel and $$Z(\omega) = \frac{1 + j\omega C_\pi R_{tune}}{g_m + j\omega C_\pi \left(\frac{\omega C_\pi}{g_m}\right)^2}. \quad [8]$$

$$\text{If } g_m >> \omega C_\pi \left(\frac{\omega C_\pi}{g_m}\right)^2 \quad [9]$$

-continued or since $f_T \simeq \frac{g_m}{2\pi C_\pi}$ and if $\left(\frac{f}{f_T}\right)^3 << 1$ then $$Z(\omega) \simeq \frac{1}{g_m} + \frac{j\omega C_\pi R_{tune}}{g_m} \quad [10]$$

which corresponds to a standard form for impedance:

$$Z = R + j\omega \cdot L. \quad [11]$$

Figure 6:
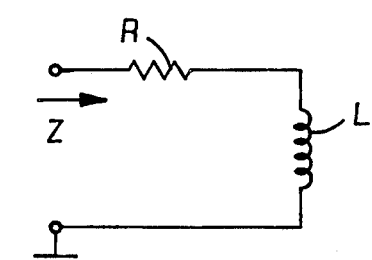
FIG. 6 is a model of a resistor and an inductor forming an RLC tank circuit.

In FIG. 6, the controllable impedance Z is shown as a model RL tank circuit 150 with a resistance component R corresponding to:

$$R = R_e\{Z(\omega)\} = \frac{1}{g_m} = \frac{kT}{I_c \cdot q} \text{; and} \quad [12]$$

an inductive reactance component L corresponding to:

$$L = I_m\{Z(\omega)\} = \omega \frac{C_\pi(I_c) \cdot R_{tune}}{I_c \cdot q} \cdot kT. \quad [13]$$

Since $I_c$ is equal to the quiescent bias current I (indicated by the arrow 142 in FIGS. 2, 3 and 5), the resistance R is dependent only on the quiescent bias current I which is varied by the current source/mirror 140. The resistance R is not dependent upon the resistance value of the resistor 92 (e.g. $R_{tune}$).

Figure 7:
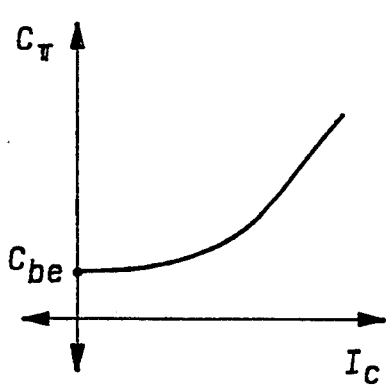
FIG. 7 is a graph of $C_\pi$ as a function of $I_c$ (or the quiescent bias current)

In contrast, the inductive reactance component L is dependant upon the resistor 92 (e.g. $R_{tune}$) in the numerator. The inductive reactance component L is also dependant upon $I_c$ which is equal to the quiescent bias current I provided by the current mirror/source 140. $C_\pi$ varies as a function of $I_c$ as shown in FIG. 7 since:

$$C_\pi = C_{be} + C_{diffusion}.$$

$C_{be}$ is a constant while $C_{diffusion}$ varies with $I_c$. $I_c$ is equal to the quiescent bias current I (142) and is varied by current source/mirror 140.

Figure 8:
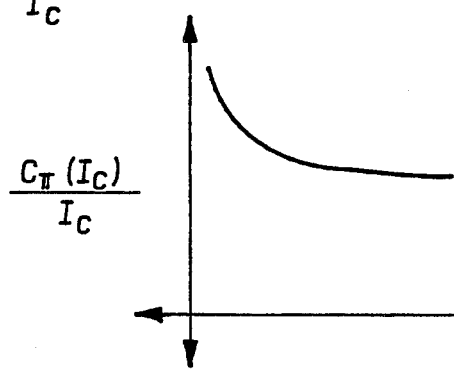
FIG. 8 is a graph of a current dependant ratio.

In FIG. 8, a current dependent ratio $C_\pi (I_c)/I_c$ equation is shown. As can be appreciated from FIG. 8, the current dependent ratio can be tuned over a reasonable range of quiescent bias currents or $I_c$.

Therefore, FIGS. 4–8 and equations 1–13 show that the imaginary (or inductive reactance) components of the controllable impedance Z can be varied as a function of the resistor 92 (or $R_{tune}$) and the quiescent bias current I (arrow 142) (or $I_c$). The real (or resistive) component of the controllable impedance Z can be varied as a function of the quiescent bias current I (arrow 142) (or $I_c$).

At low $I_c$ (or quiescent bias current), both $C_\pi$ and $g_m$ decrease proportionally with respect to $I_c$. At a lower current level, $C_\pi$ stops decreasing because of the $C_{depletion}$ (constant) of $C_\pi$ dominates $C_{diffusion}$ (varies with $I_c$). Therefore, any current below the lower current level will begin to increase the inductive reactance component of the controllable impedance Z.

Several limitations to the above explanation must be considered. First, there is an upper frequency limit of operation where the device parasitics take over and the desired inductive impedance characteristics are lost. In a practical setting, the upper frequency limit experienced is approximately 70% of the device cutoff frequency, $f_T$. Secondly, at higher currents, the inductive reactance component of the controllable impedance Z will not increase with $I_c$ (or the quiescent bias current I (arrow 142) due to the fixed ratio of $C_\pi$ divided by $g_m$, since both the numerator and denominator are proportional to the current $I_c$ (or the quiescent bias current).

Figure 9:
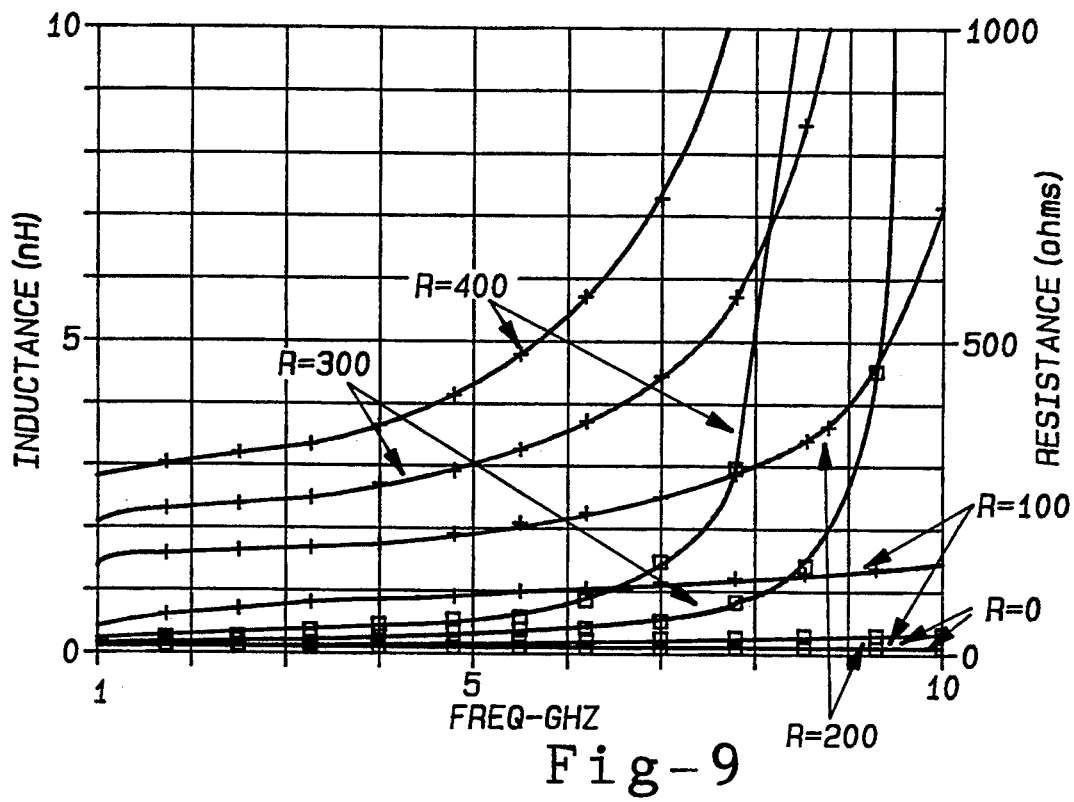
FIG. 9 is a graph of real (or resistive) and imaginary (or inductive) components of the controllable impedance as a function of frequency and the resistor 92 (or $R_{tune}$)

The frequency of oscillation of the VCO circuit 10 is related to the inductive reactance characteristics of the tuneable active inductor 40. The tuneable active inductor 40 can be coarsely tuned changing the resistance value of the resistor 92 (or $R_{tune}$). In FIG. 9, the controllable impedance Z of the active inductor circuit 40 is illustrated as a function of the resistance value of the resistor 92. Each resistance value of the resistor 92 is associated with two curves. An upper curve represents the inductive reactance component and a lower curve represents the resistive component of the controllable impedance. The current mirror/source 140 looks like a very high impedance looking into the collector 114 of the transistor 60, and therefore does not significantly effect the controllable impedance Z of the tuneable active inductor 40. As can be appreciated from FIG. 9, as the resistance value of the resistor 92 is increased (0 ohms to 400 ohms), the inductive reactance component of the impedance increases.

Figure 10:
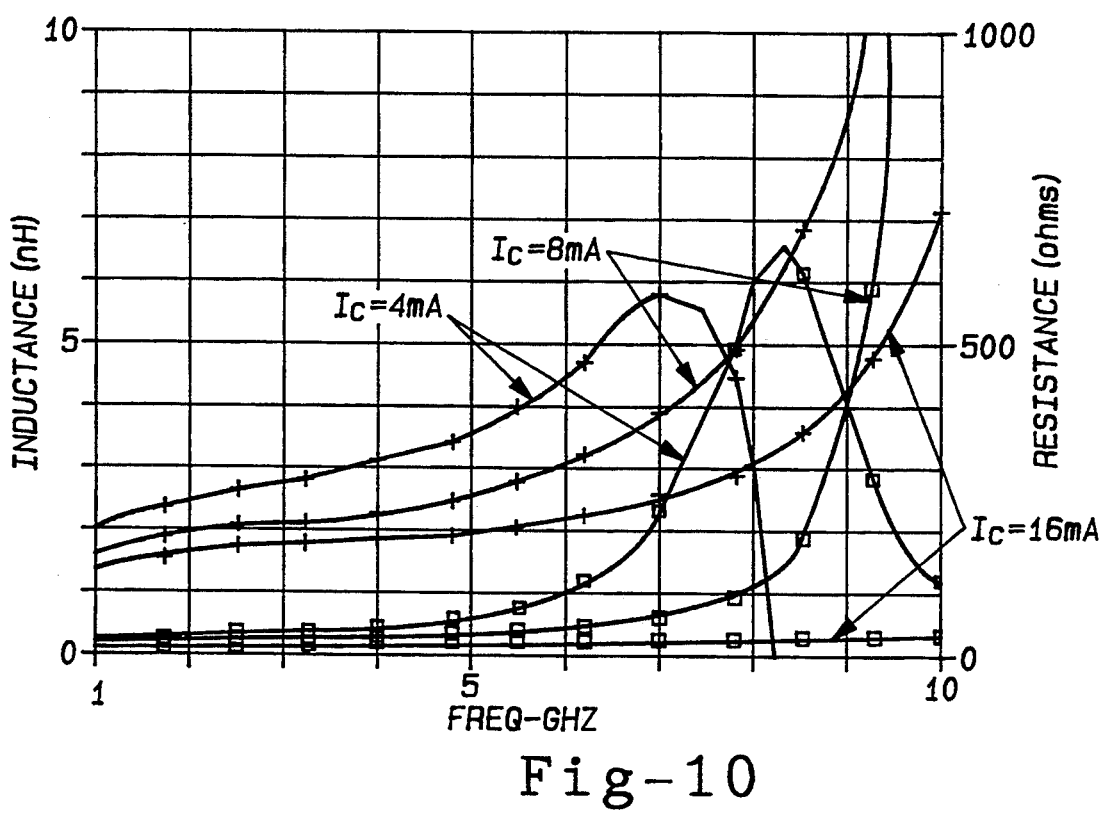
FIG. 10 is a graph of the real (or resistive) and the imaginary (or inductive) components of the controllable impedance as a function of frequency and $I_c$ (or the quiescent bias current)

In FIG. 10, the real (resistive) and imaginary (inductive reactance) components of the input impedance are plotted as a function of frequency and the quiescent bias current I (arrow 142 in FIGS. 2 and 3) or $I_c$. As can be appreciated, by increasing $I_c$ the inductance reactance component of the controllable impedance Z decreases significantly while the resistive component has only minute variation. Device parasitics destroy the desired effect on the inductive reactance component of the controllable impedance Z. As the current continues increasing, the inductive reactance component stops increasing due to the fixed ratio of $C_\pi$ divided by $g_m$.

Figure 11:
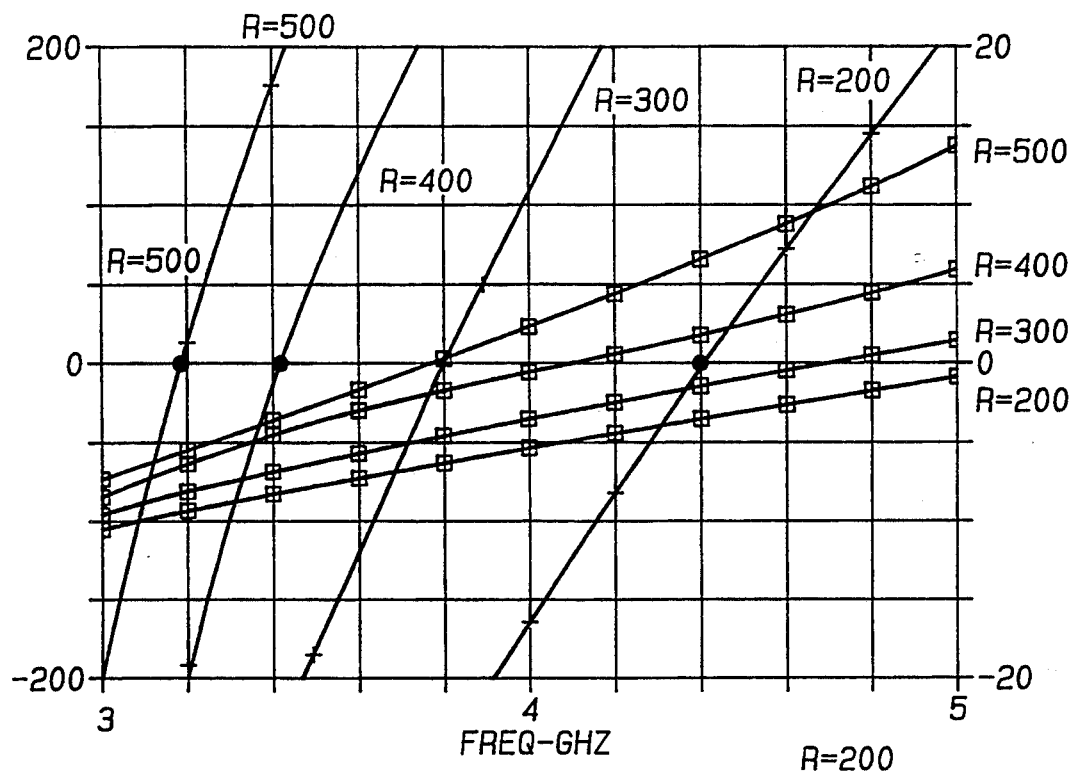
FIG. 11 is a graph of an oscillation frequency of the VCO circuit as a function of the resistor 92 (or $R_{tune}$)

In FIG. 11, the frequency of the oscillation is plotted as a function of the resistance value of the resistor 92 (or $R_{tune}$). Oscillation occurs at the frequency where the imaginary component crosses the zero axis with a positive slope while the real component is negative. The following frequencies of oscillation were obtained:

| $R_{tune}$ (resistor 92) | $f_o$ (GHZ) |
| --- | --- |
| 500 | 3.2 |
| 400 | 3.4 |
| 300 | 3.8 |
| 200 | 4.4 |

Figure 12:
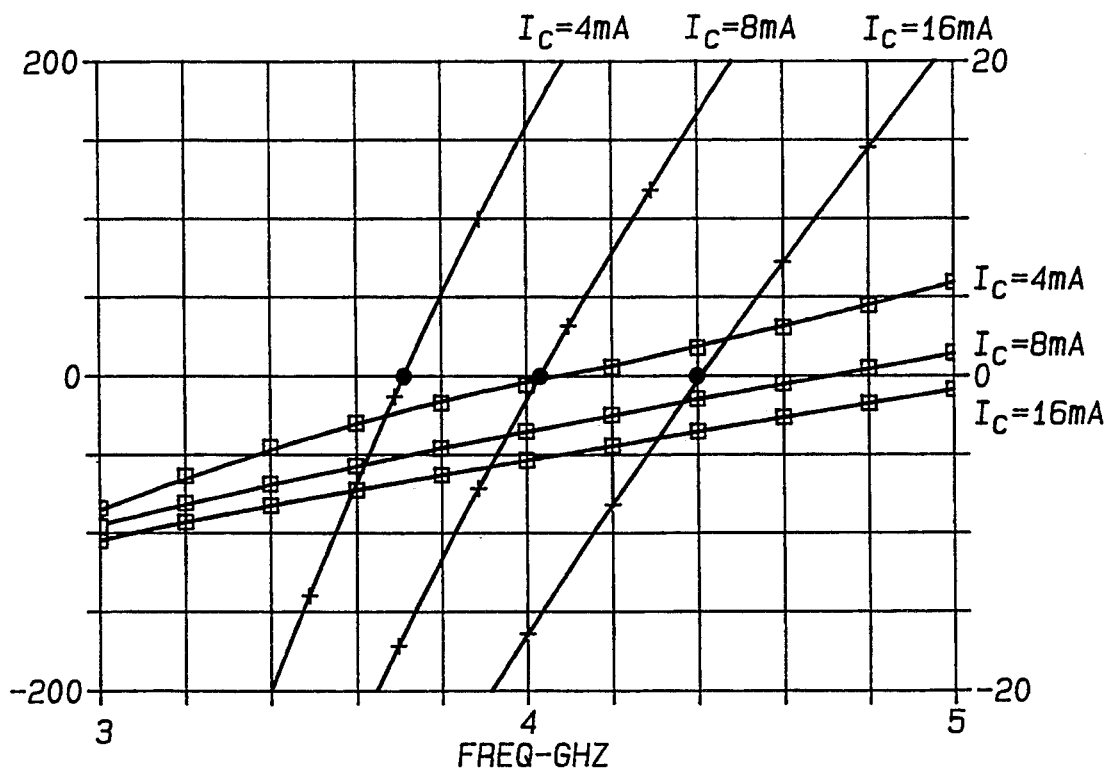
FIG. 12 is a graph of an oscillation frequency of the VCO circuit as a function of $I_c$ (or the quiescent bias current).

In FIG. 12, the frequency of oscillation is plotted as a function of the quiescent bias current I (arrow 142 in FIGS. 2 and 3) (or $I_c$). Oscillation occurs as described above with respect to FIG. 11. The following frequencies of oscillation were obtained:

| I (or $I_c$) (mA) | $f_o$ (GHZ) |
| --- | --- |
| 4 | 3.7 |
| 8 | 4.0 |
| 16 | 4.4 |

As can be appreciated, voltage controlled oscillators according to the present invention can be fabricated with acceptable phase noise (due to higher Q) using 5-10 times less chip area than previously required for microwave designs using conventional spiral inductors. The voltage controlled oscillators are also fabricated using a simplified process as compared with conventional designs requiring a more complex and more expensive fabrication process. Because of the monolithic design, cost can be reduced by a factor of 5.

Those skilled in the art can now appreciate from the foregoing description that the broad teachings of the present invention can be implemented in a variety of forms. Therefore, while this invention has been described in connection with particular examples thereof, the true scope of the invention should not be limited since other modifications will become apparent to the skilled practitioner upon study of the drawings, specification and following claims.

What is claimed is:

1. A voltage controlled oscillator for providing a fixed amplitude output at an adjustable frequency, said voltage controlled oscillator comprising:
    a first transistor including an emitter, a base and a collector;
    capacitance means connected between said emitter and said base of said first transistor for providing a first capacitance therebetween;
    inductance simulating means for generating a controllable impedance and including second and third transistors each with a base, an emitter, and a collector, wherein the second and third transistors are connected between the base and the collector of said first transistor and wherein the controllable impedance includes an inductive reactance component related to a quiescent bias current flowing through the third transistor; and
    current means connected to said third transistor for generating said quiescent bias current to vary said inductive reactance component, wherein said inductive reactance component and said first capacitance vary said adjustable frequency of oscillation.

2. The voltage controlled oscillator of claim 1 wherein said adjustable frequency is in a microwave frequency range.

3. The voltage controlled oscillator of claim 1 wherein the quiescent bias current flows through the emitter of the third transistor and wherein the current means is connected to the emitter of the third transistor.

4. The voltage controlled oscillator of claim 1 further including a tuning means for generating a tuning voltage and wherein said quiescent bias current generated by said current means is controlled by said tuning voltage.

5. The voltage controlled oscillator of claim 1 wherein said second and third transistors are heterojunction bipolar transistors.

6. The voltage controlled oscillator of claim 1 wherein the collector of said third transistor is connected to the emitter of said second transistor.

7. The voltage controlled oscillator of claim 6 further including second capacitance means connected between said base of said second transistor and the emitter of the third transistor for providing a second capacitance.

8. The voltage controlled oscillator of claim 6 further including:
    tuning resistance means connected to the base of the third transistor for providing a tuning resistance; and
    a third capacitance means connected to the collector of the second transistor and to the tuning resistor for providing a third capacitance, wherein said inductive reactance component is related to the tuning resistance of the tuning resistance means.

9. The voltage controlled oscillator of claim 8 wherein said tuning resistance means is an electronically variable resistance device.

10. The voltage controlled oscillator of claim 4 wherein the current means includes:
    a fourth bipolar transistor having a base and a collector connected through a first resistor to the tuning means; and
    a fifth bipolar transistor having a collector connected to the emitter of the third transistor, a base connected to the base of the fourth transistor, and an emitter connected to an emitter of the fourth transistor,
    wherein the quiescent bias current is provided at the collector of the fifth transistor.

11. The voltage controlled oscillator of claim 10 wherein the second, third, fourth and fifth transistors are monolithic hetero-junction bipolar transistors.

12. A voltage controlled oscillator for providing a fixed amplitude output at an adjustable frequency, said oscillator comprising:
    a first transistor including an emitter, a base and a collector;
    first capacitor connected between the emitter and the base of the first transistor;
    inductance simulating means for generating a controllable impedance and including second and third bipolar transistors each with a base, an emitter, and a collector, wherein the second and third bipolar transistors are connected between the base and the collector of the first transistor and wherein the controllable impedance includes an inductive reactance component related to a quiescent bias current flowing through the emitter of the third bipolar transistor;
    current means connected to the emitter of the third bipolar transistor for generating the quiescent bias current to vary the inductive reactance component, wherein the inductive reactance component and the first capacitance vary the adjustable frequency of oscillation;
    tuning means for generating a tuning voltage wherein the quiescent bias current generated by the current means is controlled by the tuning voltage;
    a second capacitor connected between the base of the second bipolar transistor and the emitter of the third bipolar transistor;
    a tuning resistance means connected to the base of the third bipolar transistor for providing a tuning resistance; and
    a third capacitor connected to the collector of the second bipolar transistor and to the tuning resistance means,
    wherein the inductive reactance component is related to the tuning resistance of the tuning resistance means,
    wherein the current means includes a fourth bipolar transistor having a base and a collector connected through a first resistor to the tuning means, and a fifth bipolar transistor having a collector connected to the emitter of the third transistor, a base connected to the base of the fourth transistor, and an emitter connected to an emitter of the fourth transistor, and
    wherein the first, second, third and fourth transistors are monolithic.

* * * * *